(12) United States Patent
Min et al.

(10) Patent No.: US 7,394,123 B2
(45) Date of Patent: Jul. 1, 2008

(54) MAGNETIC RANDOM ACCESS MEMORY ARRAY WITH THIN CONDUCTION ELECTRICAL READ AND WRITE LINES

(75) Inventors: Tai Min, San Jose, CA (US); Pokang Wang, San Jose, CA (US); Xizeng Shi, Fremont, CA (US); Yimin Guo, San Jose, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 86 days.

(21) Appl. No.: 11/438,179

(22) Filed: May 22, 2006

(65) Prior Publication Data

US 2006/0211155 A1    Sep. 21, 2006

Related U.S. Application Data

(62) Division of application No. 10/892,668, filed on Jul. 16, 2004, now Pat. No. 7,067,330.

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .............. 257/295; 257/431; 257/659; 257/E21.208; 257/E21.665; 257/E27.006

(58) Field of Classification Search ............ 257/295, 257/296, 68, 421, 659
See application file for complete search history.

(56) References Cited

U.S. PATENT DOCUMENTS

| 5,650,958 | A | 7/1997 | Gallagher et al. |
| 6,166,948 | A | 12/2000 | Parkin et al. |
| 6,211,090 | B1 | 4/2001 | Durlam et al. |
| 6,509,621 | B2 | 1/2003 | Nakao |
| 6,611,455 | B2 | 8/2003 | Sekiguchi et al. |
| 7,067,330 | B2 * | 6/2006 | Min et al. ............ 438/3 |
| 7,132,707 | B2 * | 11/2006 | Min et al. ............ 257/295 |
| 2003/0199104 | A1 | 10/2003 | Leuschner et al. |
| 2003/0203510 | A1 | 10/2003 | Hineman et al. |
| 2003/0206461 | A1 | 11/2003 | Freitag et al. |
| 2004/0095804 | A1 | 5/2004 | Hidaka |
| 2006/0014346 | A1 * | 1/2006 | Min et al. ............ 438/257 |
| 2006/0028862 | A1 | 2/2006 | Min et al. |

OTHER PUBLICATIONS

"A 0.18µm Logic-based MRAM Technology for High Performance Nonvolatile Memory Applications", by A.R. Sitram et al., MRAM Development Alliance, IBM/Infinean Technologies, Hopewell Junction, NY, USA, date unknown.

* cited by examiner

*Primary Examiner*—David Nhu
(74) *Attorney, Agent, or Firm*—Saile Ackerman LLC; Stephen B. Ackerman

(57) ABSTRACT

An MTJ MRAM cell is formed between ultra-thin orthogonal word and bit lines of high conductivity material whose thickness is less than 100 nm. Lines of this thickness produce switching magnetic fields at the cell free layer that are enhanced by a factor of approximately two for a given current. Because the lines require thinner depositions, there is no necessity of removing material by CMP during patterning and polishing. Therefore, there is a uniform spacing between the lines and the cell free layer.

12 Claims, 3 Drawing Sheets

MAGNETIC RANDOM ACCESS MEMORY ARRAY WITH THIN CONDUCTION ELECTRICAL READ AND WRITE LINES

This is a divisional application of U.S. patent application Ser. No. 10/892,668, filed on Jul. 16, 2004, now issued as U.S. Pat. No. 7,067,330.

RELATED PATENT APPLICATIONS

This Application is related to Ser. No. 10/910,725, filed on Aug. 3, 2004 and assigned to the same assignee as the present application.

BACKGROUND OF THE INVENTION

1. Field of the Invention

This invention relates to the design and fabrication of magnetic tunnel junctions (MTJ) as memory storage devices, particularly to a design wherein word and bit lines are ultra-thin so as to produce higher magnetic flux at the MTJ free layer for a given write current.

2. Description of the Related Art

The magnetic tunnel junction (MTJ) basically comprises two electrodes, which are layers of magnetized ferromagnetic material, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, however, because it depends on the availability of tunneling states that accept electrons with different spin orientations. Therefore, the overall tunneling current will depend on the number of spin-up vs. spin-down electrons, which in turn depends on the orientation of the electron spin relative to the magnetization direction of the ferromagnetic layers. Thus, if the relative magnetization directions are varied for a given applied voltage, the tunneling current will also vary. As a result of this behavior of an MTJ, sensing the change of tunneling current for a fixed voltage can enable a determination of the relative magnetization directions of the two ferromagnetic layers that comprise it.

The use of an MTJ as an information storage device requires that the magnetization of at least one of its ferromagnetic layers can be varied relative to the other and also that changes in these relative directions can be sensed by means of variations in the tunneling current or, equivalently, the junction resistance. In its simplest form as a two state memory storage device, the MTJ need only be capable of having its magnetizations put into parallel (low resistance) or antiparallel (high resistance) configurations, when writing data, and of having its tunneling current variations or resistance variations measured, when reading data.

In practice, the free ferromagnetic layer of the MTJ can be modeled as having a magnetization which is free to rotate but which energetically prefers to align in either direction along its easy axis (the direction of magnetic crystalline anisotropy). The magnetization of the fixed layer may be thought of as being permanently aligned in its easy axis direction. When the free layer is anti-aligned with the fixed layer, the junction will have its maximum resistance, when the free layer is aligned with the fixed layer, the minimum resistance is present. In typical MRAM circuitry, the MTJ devices are located at the intersection of orthogonal current carrying lines called word lines and bit lines. When both lines are carrying current, the device is written upon by having the magnetization direction of its free layer changed. When only one line is carrying current, the resistance of the device can be sensed, so the device is effectively read. Note that an additional current carrying line may be present in some device configurations to sense the resistance of the device, but in simplest terms the device behaves as described above. Such an MTJ device is provided by Gallagher et al. (U. S. Pat. No. 5,650,958), who teach the formation of an MTJ device with a pinned ferromagnetic layer whose magnetization is in the plane of the layer but not free to rotate, together with a free magnetic layer whose magnetization is free to rotate relative to that of the pinned layer, wherein the two layers are separated by an insulating tunnel barrier layer.

In order for the MTJ MRAM device to be competitive, in terms of power consumption and device density, with other forms of DRAM, it is necessary that the MTJ be made very small, typically of sub-micron dimension. Parkin et al. (U. S. Pat. No. 6,166,948) teaches the formation of an MTJ MRAM cell in which the free layer is formed of two antiparallel magnetized layers separated by a spacer layer chosen to prevent exchange coupling but to allow direct dipole coupling between the layers. The free layer thereby has closed flux loops and the two layers switch their magnetizations simultaneously during switching operations. Parkin notes that sub-micron dimensions are needed to be competitive with DRAM memories in the range of 10-100 Mbit capacities. Parkin also notes that such small sizes are associated with significant problems, particularly super-paramagnetism, which is the spontaneous thermal fluctuation of magnetization in samples of ferromagnetic material too small to have sufficient magnetic anisotropy (a measure of the ability of a sample to maintain a given magnetization direction). To overcome the undesirable spontaneous thermal fluctuations in MRAM cells with very small cross-sectional areas, it is necessary to make the magnetic layers thick. Unfortunately, the size of the required switching field increases with layer thickness, so the price paid for a thermally stable cell is the necessity of expending a great deal of current to change the magnetic orientation of the cell's free layer.

Some degree of anisotropy is necessary if an MTJ cell is to be capable of maintaining a magnetization direction and, thereby, to effectively store data even when write currents are zero. As cell sizes have continued to decrease, the technology has sought to provide a degree of magnetic anisotropy by forming cells in a wide variety of shapes (eg. rectangles, diamonds, ellipses, etc.), so that the lack of inherent crystalline anisotropy is countered by a shape anisotropy. Yet this form of anisotropy brings with it its own problems. A particularly troublesome shape-related problem in MTJ devices results from non-uniform and uncontrollable edge-fields produced by shape anisotropy (a property of non-circular samples). As the cell size decreases, these edge fields become relatively more important than the magnetization of the body of the cell and have an adverse effect on the storage and reading of data. Although such shape anisotropies, when of sufficient magnitude, reduce the disadvantageous effects of super-paramagnetism, they have the negative effect of requiring high currents to change the magnetization direction of the MTJ for the purpose of storing data.

One way of addressing the problem of the high currents needed to change the magnetization direction of a free layer when its shape anisotropy is high, is to provide a mechanism for concentrating the fields produced by lower current values. This approach was taken by Durlam et al. (U.S. Pat. No. 6,211,090 B1) who teach the formation of a flux concentrator, which is a soft magnetic (NiFe) layer formed around a copper damascene current carrying line. The layer is formed around three sides of the copper line which forms the digit line at the underside of the MRAM cell.

Two additional approaches are taught by Nakao, (U.S. Pat. No. 6,509,621 B2), who, in one embodiment, forms a pinned layer out of a material that produces a high percentage of spin polarized electrons in the current and in another embodiment, applies an offsetting magnetic field produced by a magnetic shield to assist in causing field reversals in the cell element.

Yet another approach is taught by Sekiguchi et al., (U.S. Pat. No. 6,611,455 B2) who forms free layers with easy axes that are perpendicular to the layer plane, then forms word and bit lines in the same plane.

The present invention also addresses the problem of reducing the high current required to reorient the magnetization of the free layer in ultra-small MRAM cells wherein the superparamagnetic behavior requires thick free layers. It does so by forming word and/or bit lines of exceptional thinness, specifically under 100 nm, compared to conventional thicknesses of approximately 300 nm, thereby increasing the switching field at the free layer by as much as a factor of 2. An additional benefit of such thin lines is the ease of their fabrication. The patterning process for their formation requires the removal of less material and can eliminate the need for chemical mechanical polishing (CMP), which can produce uncontrollable variations in line thicknesses. Finally, these ultra-thin lines are easily formed into a variety of configurations with respect to their positions relative to the MTJ cell. In the present invention the cell is positioned between the word and bit lines. In the following description the general method of forming the lines will be described along with illustrations of their placement relative to the cell.

SUMMARY OF THE INVENTION

A first object of this invention is to provide an MTJ MRAM cell that makes more efficient use of word and bit line switching currents, the lines thereby producing magnetic fields of sufficient intensity for switching, while requiring lower currents to do so.

A second object of this invention is to provide a method for fabricating such a cell and its word and bit lines that simplifies the fabrication process and, in particular, eliminates uncontrollable variations associated with the process of chemical-mechanical polishing (CMP).

A third object of this invention is to provide such cells and arrays of such cells.

These objects will be achieved by an MRAM cell design and fabrication method in which word and/or bit lines are formed of highly conductive materials to an exceptional thinness of less than 100 nm. The conducting material can be high conductivity materials such as Al, Cu, Au, Ru, Ta, CuAu, CuAg, NiCr, Rh and multilayers of these materials such as multiple laminations of (NiCr/Cu).

In conventional word and bit lines of the prior art, the aspect ratio (ratio of thickness, t, to width w) of word/bit lines is close to one. Applying simple physics (Ampere's Law) indicates that the magnetic field, $H_s$, at the surface of a prior art line of comparable thickness, t, and width, w, carrying current I is given by: $H_s = \pi I/w$.

For the proposed ultra-thin word/bit line design, where w>>t, the magnetic field obeys the following relationship: $H_s = 2\pi I/w$. Thus, there is an enhancement of the magnetic field at the wire surface by a factor of two. Since the MRAM cell is located a small distance from the line surface, the benefit will be somewhat reduced, but will still be substantial, particularly since the fabrication method allows the distance between line and cell to be kept uniformly small.

FIG. 1a shows a vertical cross-sectional view of the MTJ MRAM cell of the present invention. The multilayered cell element, whose horizontal cross-section is substantially circular, is at a vertically separated intersection of an ultra-thin write word line (10) extending in length along the z-axis of the illustrated axes (its width being in the x-direction and its thickness in the y-direction), and an ultra-thin bit line (20) extending in length along the x-axis (its width being in the z-direction and its thickness being in the y-direction) and vertically below the word line. These lines are used to perform write operations on the cell, i.e. to switch the magnetization of its free layer. The write word line and bit lines are separated by an insulating layer (15) and are also surrounded peripherally by insulation. The write word and bit lines have thicknesses, $t_w$ and $t_b$ respectively that are substantially less than their widths, $w_w$ and $w_b$ (not shown) in accord with the objects of the present invention, wherein $t_w$ and $t_b$ are both less than approximately 100 nm and their widths are between approximately 300 and 500 nm. It is once again noted that word and bit lines of the prior art are formed with comparable widths and thicknesses, both being between approximately 300 and 500 nm. A description of the ultra-thin write word or bit line fabrication process will be described more fully below.

An MTJ MRAM cell element (50), of thickness between approximately 200 and 400 angstroms and lateral dimension between approximately 0.3 and 0.7 microns, is shown positioned between the intersection of the word (20) and bit lines (10). The cell element is a horizontal multi-layer fabrication comprising a seed layer (51), formed on the bit line, an antiferromagnetic pinning layer (52), a synthetic ferrimagnetic pinned layer which includes a second (53) and first (55) ferromagnetic layer separated by a coupling layer (54), a tunnel barrier layer (56), a free layer (57), which can also be a laminated structure, and a capping layer (58) beneath the bit line. An additional conducting electrode, called a read word line (59), used in read operations, is formed on an upper surface of the cell. The word line is separated by insulation (15) from the conducting electrode. It is also possible to eliminate the electrode and have the word line electrically contact the upper cell surface. A detailed description of materials and dimensions used in the cell and in the fabrication process will be discussed below within the description of the preferred embodiment.

BRIEF DESCRIPTION OF THE DRAWINGS

FIG. 1b schematically shows a vertical cross-sectional view of an MTJ MRAM cell of the present invention in an alternative configuration to that in FIG. 1a.

FIG. 1d schematically shows an array of two cells of the type in FIG. 1a.

DESCRIPTION OF THE PREFERRED EMBODIMENT

Figure 1A:
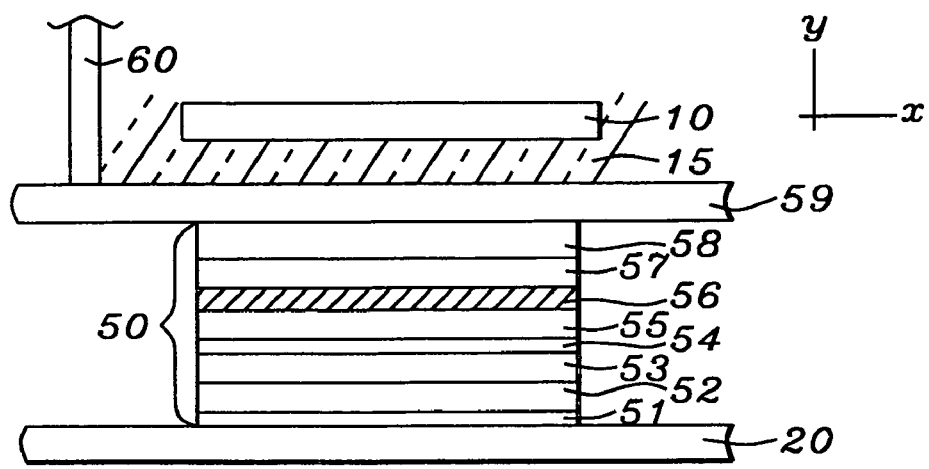
FIG. 1a is a schematic vertical cross-sectional view of an MTJ MRAM cell having its cell element formed between ultra-thin word and bit lines of the present invention.

The preferred embodiment of the present invention is an MTJ MRAM cell formed at an intersection of ultra-thin word and bit lines, more specifically between those lines, so that smaller currents can still produce adequate switching fields at the location of the cell free layer.

Referring again to FIG. 1a, there is shown the multi-layered MTJ cell element (50) formed between orthogonally directed, vertically separated ultra-thin word (10) and bit (20) lines of the invention. The two lines extend in vertically separated horizontal planes, crossing over each other but insulated from each other and forming, thereby, an intersection at which the cell is located. In all that follows, the term "intersection" is taken to mean a vertically separated crossing of lines. The word line is directed perpendicularly out of the figure plane, the bit line is within the figure plane. An additional conducting electrode, (alternatively denoted a read-word line), used in read operations (59), is formed on an upper surface of the cell. During operation of the cell, the conducting electrode will normally be connected to an accessing transistor which is used to determine the logic state of the MRAM cell. The electrode is insulated from and separated from the word line, but it is clear that the separation should be kept as small as possible to maintain the field strength of the word line at the free layer of the cell. The bit line (20) can be formed as a single layer of high conductivity material such as Al, Cu, Au, Ru, Ta, CuAu, CuAg, NiCr, Rh and multilayers of these materials such as multiple laminations of (NiCr/Cu), formed to a thickness of approximately 100 nm or less and a width between approximately 300 and 500 nm. As previously noted, an additional conducting electrode (59), called a read word line, extending along the x-direction is formed contacting the upper surface of the cell and is used in conjunction with the bit line (20) for read operations. A connecting line (60) goes from the electrode (59) to a terminal of an accessing transistor (not shown), which is a part of the circuitry used to determine the logic state (i.e. its resistance) of the MRAM cell. In the particular configuration shown in FIG. 1a, a single MRAM cell is connected to a single transistor. A partial array of two such cells, an example of which is shown in FIG. 1d, each formed between vertically separated, intersecting word and bit lines and each accessed by its own transistor, would form part of a particular MRAM array design.

Referring back to the cell element (50), a seed layer (51) is formed on the bit line (20) and promotes the high quality formation of subsequently formed layers of the cell. The seed layer can be a layer of NiCr or NiFe formed to a thickness between approximately 5 and 100 angstroms. A single pinned layer or, as in this embodiment, a synthetic ferrimagnetic pinned layer is formed on the seed layer. The synthetic layer includes an antiferromagnetic pinning layer (52), a second ferromagnetic layer (53), a coupling layer (54) and a first ferromagnetic layer (55). The antiferromagnetic layer pins the magnetization of the second ferromagnetic layer unidirectionally and the first ferromagnetic layer is magnetized in an antiparallel direction to that of the first layer. The first and second ferromagnetic layers are layers of CoFe formed to thicknesses between approximately 5 and 100 angstroms and matched so that the net magnetic moment of the configuration is substantially zero. The coupling layer is a layer of Rh, Ru, Cr or Cu of proper thickness to maintain strong antiparallel coupling between the magnetic moments. The antiferromagnetic pinning layer (52) can be a layer of PtMn, NiMn, OsMn, IrMn, PtPdMn, PtCrMn or FeMn of thickness between approximately 10 and 500 angstroms.

A tunneling barrier layer (56) is formed on the first ferromagnetic layer (55) of the pinned layer. This layer is a layer of insulating material such as oxidized Al or an oxidized Al—Hf bilayer and is formed to a thickness between approximately 7 to 15 angstroms. A ferromagnetic free layer (57) is formed on the barrier layer. The free layer can be a single layer of ferromagnetic material, such as a layer of CoFe or NiFe formed to a thickness between approximately 5 and 100 angstroms or it can be a multilayer, comprising first and second ferromagnetic layers, magnetized in antiparallel directions and separated by a spacer layer of non magnetic but conducting material such as Rh, Ru, Cr or Cu, which is of the proper thickness to maintain strong antiparallel coupling between the two ferromagnetic layers. During formation of the cell it is advantageous to set the magnetic anisotropy direction of the ferromagnetic layers either perpendicular or parallel to the bit line. A capping layer (58) is formed on the free layer and completes the cell element (50). The capping layer can be a layer of Ru, or Ta or a multilayer of Ru/Ta formed to a thickness between approximately 5 and 100 angstroms. The read word line (59) is formed on the capping layer (58) of the cell element (50). A layer of insulating material (15) surrounds the cell and separates the write word line (10) from the bit line (20) and the read word line (59) from the word line (10). The write word line (10), like the bit line, is an ultra-thin layer of conducting material less than 100 nm in thickness formed in accord with the method of this invention. It is further noted that the separation between the read and write word lines must be kept as small as possible to maintain the strength of the write word line magnetic field at the cell element free layer. A separation no greater than the thickness of the ultra-thin lines is preferable.

Figure 1B:
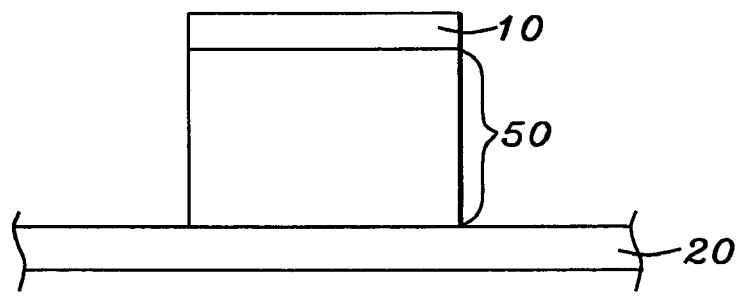

Referring to FIG. 1b, there is shown an MTJ MRAM design employing the ultra-thin word (10) and bit (20) lines of the present invention, but differing from the design of FIG. 1a in that the read word line ((59) in FIG. 1a) is absent and, instead, the write word line (10) is formed contacting the upper surface of the cell element (50). The cell element is identical to the cell element in FIG. 1a, so it is not drawn in detail. In this configuration, the logic state of the cell is determined using only the write word line and bit line.

Figure 1C:
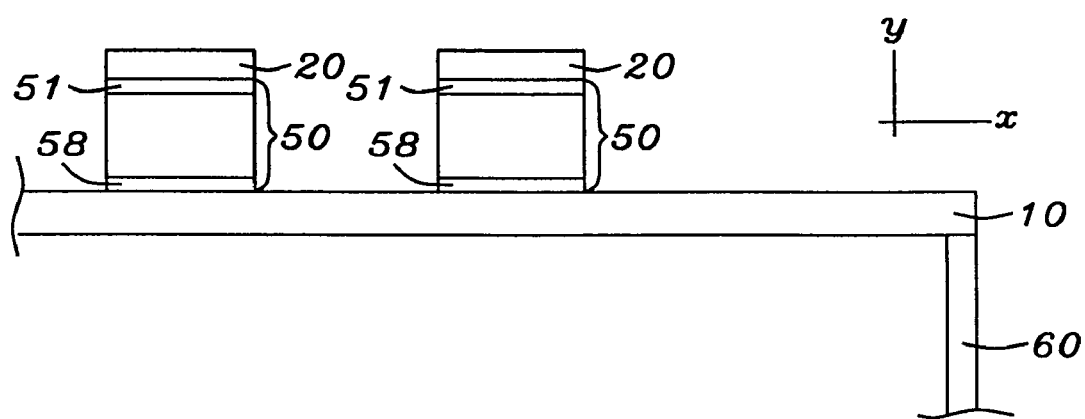
FIG. 1c is a schematic drawing of an array (two being illustrated) of MTJ MRAM cells formed between ultra-thin word and bit lines.
Figure 1D:
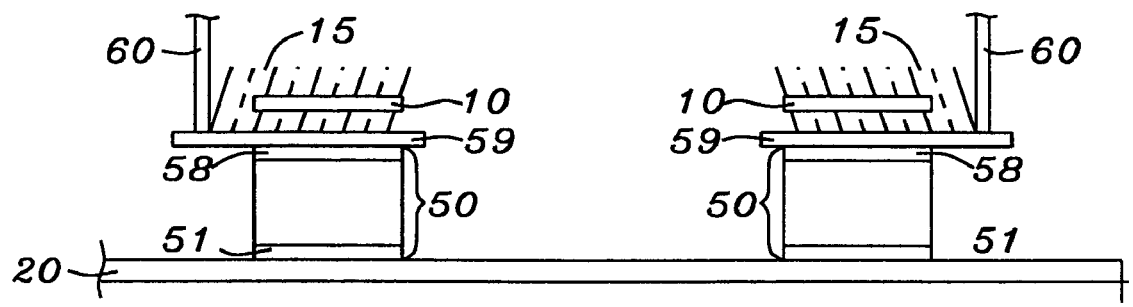

Referring to FIG. 1c, there is shown, schematically, an array of MRAM cells, in which a plurality of cell elements (50) (two being shown), each element being identical to the cell element in FIG. 1a, is formed between a common word line (10) and an individual bit line (20), in the configuration of FIG. 1b. The word line is then connected to a single accessing transistor (not shown) by a connecting conductor (60). Each cell, of which only two are shown for clarity and both are labeled (50), is formed contacting a separate bit line, labeled (20), which is directed out of the plane of the figure. The upper surface of the cell element, which in this configuration is the capping layer (58), contacts the lower surface of the bit line (20) and the lower surface of the cell element, which is the seed layer (51), contacts the upper surface of the word line (10). There is no separate electrode, such as that denoted by (59) in FIG. 1a. The word line (10) and the bit lines (20) are formed in accord with the method of the invention to be described below with reference to FIGS. 2a-2d. In this configuration, all the cells contacting the common word line are accessed by a single transistor. It is noted that this array can be inverted, so that the word line is above the bit lines, the cell element has its layers inverted and the accessing transistor is above the word line.

Referring to FIG. 1d, there is shown an array of two MTJ MRAM cells, each of the configuration of FIG. 1a, wherein each cell element (50) is placed between intersecting word

(10) and bit (20) lines formed using the method of the present invention and wherein the same bit line (20) is common to each cell but each word line is above an individual cell element. An electrode (59) is formed contacting the upper surface of each cell on its capping layer (58) and insulated (15) from the word line, and each electrode is connected to an accessing transistor (not shown) by a conducting line (60). In this array configuration there is one transistor for each cell. It is noted that the entire configuration may be inverted, so that the bit line is vertically above the cell and the cell layer structure is inverted relative to the illustration in FIG. 1a.

Referring now to FIGS. 2a-2e, there are schematically shown several of the steps involved in fabricating the bit or word lines of the present invention. The extreme thinness of the lines not only accomplishes the object of the invention, which is to provide an adequate switching field with a smaller current, but they also can be fabricated in an easier fashion than conventional thicker lines since less ion-beam etch (IBE) trimming and CMP polishing is required.

Figure 2A:
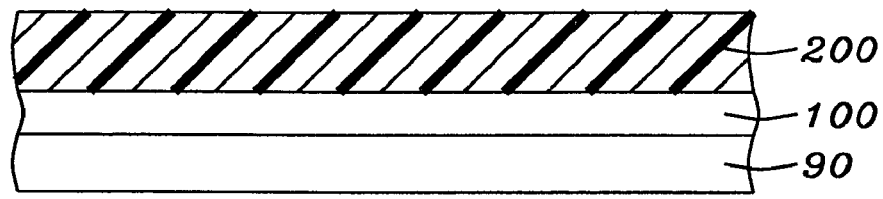
FIGS. 2a-2e provide a more detailed schematic description of the formation of an ultra-thin word or bit line, indicating how the thinness of the word and bit lines makes their formation simpler.

Referring first to FIG. 2a, there are shown the first of the process steps required to form the ultra-thin word or bit lines of the present invention. First a thin conducting layer (100) is deposited over a substrate (90) having a substantially planar upper surface, the conducting layer being deposited to the desired final thickness of the word or bit line by a process of sputtering, ion-beam deposition (IBD) or chemical vapor deposition (CVD). It is noted that the substrate may be a dielectric layer that includes MTJ MRAM cell elements whose upper surfaces are co-planar with the upper surface of the dielectric layer. Alternatively the substrate may be a dielectric layer that is formed over a conducting electrode, such as (59) in FIG. 1a. The substrate is shown here devoid of any detail. A layer of photoresist (200) is then formed on the conducting layer.

Figure 2B:
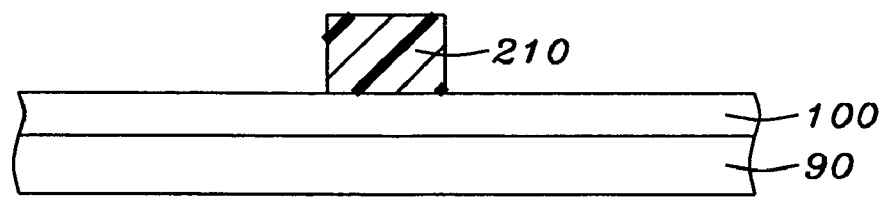

Referring to FIG. 2b, there is shown the photoresist layer now patterned (210) by a photolithographic process such as is well known in the art. The patterning produces a strip (or a plurality of strips if more than one line is to be formed) that has the width of the line to be formed and extends in the proper line direction.

Figure 2C:
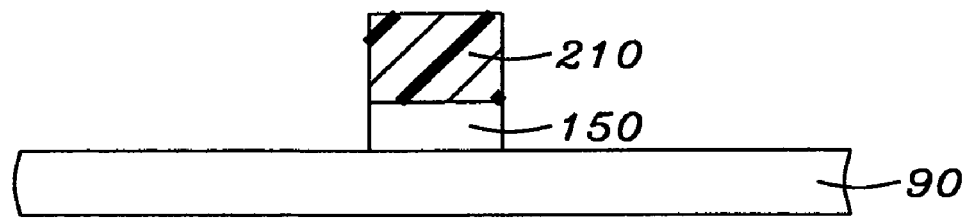

Referring to FIG. 2c, there is shown the patterned photoresist (210) having been used as a mask for an ion-beam etch (IBE) or reactive ion etch (RIE), to remove peripheral portions of the conducting layer and leave behind the desired word/bit line (150) beneath the photoresist pattern. The photoresist will then be removed (not shown) to leave only the word/bit lines (150) properly arranged over the substrate (90).

Figure 2D:
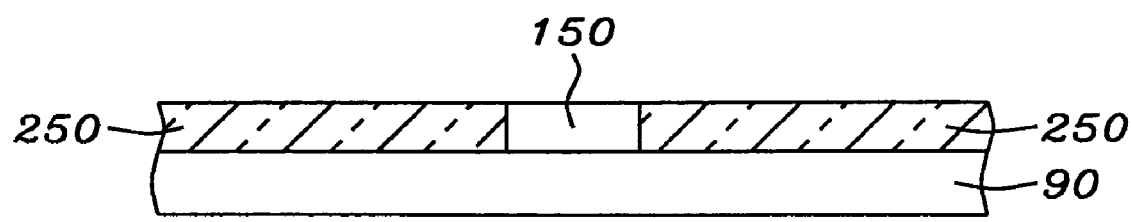

Referring to FIG. 2d, there is shown the formation of FIG. 2c wherein an insulating refill layer (250) has been deposited to fill the spaces between the word/bit line just formed and any others (not shown). In this form, MTJ cells may be formed over the word/bit lines or an orthogonal set of word lines may be formed over these lines if they are bit lines. If the lines just formed (150) are bit lines (running orthogonally to the figure plane), then the orthogonal lines formed over them will be word lines (running within the figure plane).

Figure 2E:
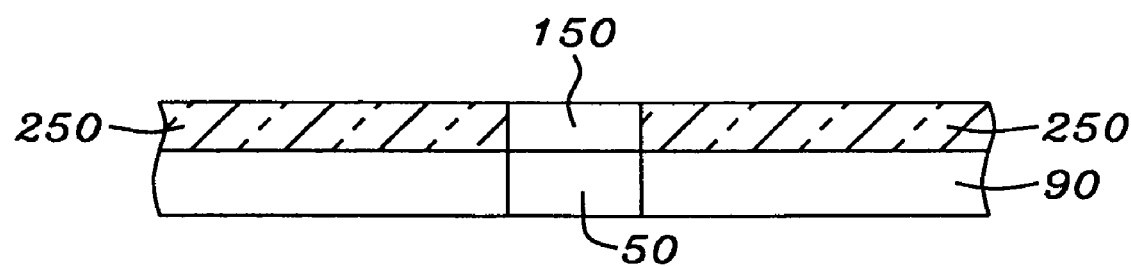

Referring finally to FIG. 2e, there is shown, just as an example, a substrate (90) that includes an MTJ MRAM cell (50), so that the ultra-thin word line (150), formed in accord with FIGS. 2a-2d, is positioned on the upper surface of the cell. It should be clear to one skilled in the art how other ultra-thin intersecting word/bit line configurations can be formed at the location of cell elements.

For uniformity and reproducibility it is required that the surfaces of the bit or word lines (150) not be smoothed or reduced in thickness by a process step of chemical mechanical polishing (CMP). Such polishing will introduce undesirable thickness variations in the lines, which variations, in turn, will adversely affect the maintaining of a sufficiently small and uniform distance between the lines and the free layer within the MTJ cell. The thickness variations result because of the difficulty in controlling the CMP lapping process and obtaining an accurate stopping point. Since CMP is therefore ruled out, the bit lines cannot be made thick, because a thick deposition will inevitably have a highly non-planar upper surface, which, without CMP, is then a cause of subsequent problems, including inaccurate photoresist patterning, poor line continuation and electro-migration. Thus, the thin deposition of the present invention eliminates the requirement of a disadvantageous CMP process and simultaneously provides the increased magnetic fields required.

As is understood by a person skilled in the art, the preferred embodiment of the present invention is illustrative of the present invention rather than being limiting of the present invention. Revisions and modifications may be made to methods, processes, materials, structures, and dimensions through which an MTJ MRAM cell, comprising a cell element between an ultra-thin bit line and an ultra-thin word line is formed and provided, while still forming and providing such an MRAM cell, in accord with the present invention as defined by the appended claims.

What is claimed is:

1. An MTJ MRAM cell formed at an intersection of ultra-thin word and bit lines comprising:
   an ultra-thin bit line, having an upper surface and a lower surface and formed of high conductivity material, extending in a first direction within a first horizontal plane and having a thickness, $t_b$, that is less than 100 nm;
   an ultra-thin write word line, having an upper surface and a lower surface and formed of high conductivity material, said write word line extending in a direction orthogonal to said first direction in a second horizontal plane that is vertically separated from said first horizontal plane and wherein said ultra-thin write word line passes vertically over said ultra-thin bit line to form a vertically separated intersection with said ultra-thin bit line and said ultra-thin word line having a thickness, $t_w$, that is less than 100 nm;
   a horizontally multilayered magnetic tunnel junction (MTJ) cell element, having an upper surface and a lower surface and including a magnetically free layer, formed at said intersection of said ultra-thin word line and said ultra-thin bit line.

2. The MTJ MRAM cell of claim 1 wherein a MTJ cell element is formed between said ultra-thin word and bit lines at their intersection and wherein the upper surface of said MTJ cell element electrically contacts the lower surface of said ultra-thin word line and the lower surface of said MTJ cell element electrically contacts an upper surface of said ultra-thin bit line and wherein said ultra-thin word and bit lines produce enhanced magnetic fields at said MTJ cell element free layer.

3. The MTJ MRAM cell of claim 1 wherein a MTJ cell element includes a conducting electrode formed on an upper surface.

4. The MTJ MRAM cell of claim 3 wherein a MTJ cell element is formed between said ultra-thin word and bit lines at their intersection and wherein a lower surface of said MTJ cell element contacts an upper surface of said ultra-thin bit line and wherein a lower surface of said ultra-thin word line is vertically above said conducting electrode and separated from said conducting electrode by a layer of insulation and wherein said ultra-thin word and bit lines produce enhanced magnetic fields at said MTJ cell element free layer.

5. The MTJ MRAM cell of claim 1 wherein said high conductivity material is Cu, Au, Al, Ag, CuAg, Ta, Cr, NiCr, NiFeCr, Ru, Rh or multiply laminated layers of said materials.

6. The MTJ MRAM cell of claim 1 wherein said MTJ cell element comprises:
   a seed layer formed on the upper surface of said ultra-thin bit line;
   an antiferromagnetic pinning layer formed on said seed layer;
   a synthetic ferrimagnetic pinned layer formed on said antiferromagnetic layer, said pinned layer comprising first and second ferromagnetic layers of substantially equal and opposite magnetic moments, separated by a first coupling layer;
   a tunneling barrier layer formed on said pinned layer;
   a ferromagnetic free layer formed on said tunneling barrier layer;
   a capping layer formed on said ferromagnetic free layer; and wherein
   the magnetic anisotropy of the ferromagnetic layers is set parallel or perpendicular to said ultra-thin bit line.

7. The MTJ MRAM cell of claim 6 wherein the ferromagnetic free layer is a synthetic ferrimagnetic layer comprising third and fourth ferromagnetic layers of substantially equal and opposite magnetic moments, separated by a second coupling layer of sufficient thickness to maintain a strong antiparallel coupling of said magnetic moments.

8. The MTJ MRAM cell of claim 6 wherein the antiferromagnetic pinning layer is a layer of PtMn, NiMn, OsMn, IrMn, PtPdMn, PtCrMn or FeMn of thickness between approximately 10 and 500 angstroms and the first and second ferromagnetic layers are layers of CoFe or NiFe formed to a thickness between approximately 5 and 100 angstroms and the coupling layer is a layer of Rh, Ru, Cu or Cr of sufficient thickness to maintain antiparallel coupling of the ferromagnetic layers.

9. An array of MTJ MRAM cells formed between intersections of ultra-thin word and bit lines of high conductivity material, said array comprising:
   at least one ultra-thin word line, having an upper surface and a lower surface, formed in a first direction;
   a plurality of identical MTJ cell elements formed, uniformly spaced, on an upper surface of said ultra-thin word line, a lower surface of each said cell element electrically contacting the upper surface of said ultra-thin word line;
   a plurality of parallel ultra-thin bit lines, each of said ultra-thin bit lines having an upper and a lower surface and the lower surface electrically contacting an upper surface of one of said MTJ cell elements and each of said ultra-thin bit lines formed in a second direction that is orthogonal to said first direction;
   an electrically conducting connection formed between said ultra-thin word line and a single accessing transistor.

10. The array of MTJ MRAM cells of claim 9 wherein each said MTJ cell element comprises:
    a seed layer formed on the lower surface of said ultra-thin bit line;
    an antiferromagnetic pinning layer formed on said seed layer;
    a synthetic ferrimagnetic pinned layer formed on said antiferromagnetic layer, said pinned layer comprising first and second ferromagnetic layers of substantially equal and opposite magnetic moments, separated by a first coupling layer;
    a tunneling barrier layer formed on said synthetic ferrimagnetic pinned layer;
    a ferromagnetic free layer formed on said tunneling barrier layer;
    a capping layer formed on said ferromagnetic free layer and contacting the upper surface of said ultra-thin word line; and wherein
    a magnetic anisotropy of the first and second ferromagnetic layers is set parallel or perpendicular to the ultra-thin bit line.

11. An array of MTJ MRAM cells formed between intersections of ultra-thin word and bit lines formed of high conductivity material, said array comprising:
    at least one ultra-thin bit line having an upper and a lower surface formed in a first direction in a first plane;
    a plurality of parallel ultra-thin word lines, each having an upper and a lower surface, formed in a second direction orthogonal to said first direction and in a second plane, parallel to said first plane and vertically above and separated from said first plane;
    a plurality of identical MTJ cell elements formed on said ultra-thin bit line between each intersection of said ultra-thin bit line and said ultra-thin word lines, each MTJ cell element having an upper and a lower surface wherein the lower surface of each said MTJ cell electrically contacts the upper surface of said ultra-thin bit line;
    a conducting electrode formed contacting the upper surface of each MTJ cell, said conducting electrode being below the lower surface of said ultra-thin word line and insulated from said ultra-thin word line and said electrode being electrically connected to an accessing transistor.

12. The array of MTJ MRAM cells of claim 11 wherein each said MTJ cell element comprises:
    a seed layer formed on the upper surface of said ultra-thin bit line;
    an antiferromagnetic pinning layer formed on said seed layer;
    a synthetic ferrimagnetic pinned layer formed on said antiferromagnetic pinning layer,
    said synthetic ferrimagnetic pinned layer comprising first and second ferromagnetic layers of substantially equal and opposite magnetic moments, separated by a first coupling layer;
    a tunneling barrier layer formed on said synthetic ferrimagnetic pinned layer;
    a ferromagnetic free layer formed on said tunneling barrier layer;
    a capping layer formed on said ferromagnetic free layer; and wherein the magnetic anisotropy of the first and second ferromagnetic layers is set parallel to or perpendicular to the ultra-thin bit line.

* * * * *